US006989698B2

(12) United States Patent
Jeong

(10) Patent No.: US 6,989,698 B2
(45) Date of Patent: Jan. 24, 2006

(54) CHARGE PUMP CIRCUIT FOR COMPENSATING MISMATCH OF OUTPUT CURRENTS

(75) Inventor: Minsu Jeong, Anyang-si (KR)

(73) Assignee: Integrant Technologies Inc., Seongnam (KR)

( * ) Notice: Subject to any disclaimer, the term of this patent is extended or adjusted under 35 U.S.C. 154(b) by 29 days.

(21) Appl. No.: 10/647,536

(22) Filed: Aug. 26, 2003

(65) Prior Publication Data

US 2004/0085106 A1 May 6, 2004

(30) Foreign Application Priority Data

Aug. 26, 2002 (KR) ...................... 10-2002-0050449
Aug. 28, 2002 (KR) ...................... 10-2002-0051198

(51) Int. Cl.
*H03L 7/06* (2006.01)

(52) U.S. Cl. ....................................... 327/157; 327/148

(58) Field of Classification Search ................ 327/148, 327/157
See application file for complete search history.

(56) References Cited

U.S. PATENT DOCUMENTS 5,508,660 A * 4/1996 Gersbach et al. ........... 327/157
5,532,636 A 7/1996 Mar et al.
6,054,882 A * 4/2000 Izumikawa ................. 327/157
6,111,468 A * 8/2000 Tanishima ................... 331/17
6,124,741 A 9/2000 Arcus
6,124,755 A * 9/2000 Parker et al. ............... 327/543
6,229,362 B1 * 5/2001 Choi .......................... 327/157
6,329,872 B1 * 12/2001 Foroudi ...................... 327/541
6,664,829 B1 * 12/2003 Hughes ...................... 327/157
2003/0076141 A1 * 4/2003 Hsu et al. ................... 327/157

* cited by examiner

*Primary Examiner*—Terry D. Cunningham
(74) *Attorney, Agent, or Firm*—Shinjyu Global IP Counselors, LLP

(57) ABSTRACT

The present invention is to provide a charge pump circuit for improving switching speed and compensating mismatch between a source and a sink currents flowing to output terminal. A charge pump circuit according to the first embodiment of the present invention comprises a first and second switching elements, a discharging and charging elements, a biasing unit, a first and second compensating unit, a charge pumping unit, a current mirror unit, a control unit, and a biasing unit. The compensating circuit removes the deterioration owing to the parasitic capacitance, and the control circuit controls the charge that is flowed or emitted from the parasitic capacitance. A charge pump circuit according to the second embodiment of the present invention comprises a charge pumping unit, a current mirror unit, a control unit a biasing unit. The charge pump circuit decects the mismatch between the output currents via the control unit, and compensates the mismatch by the biasing unit.

9 Claims, 9 Drawing Sheets

CHARGE PUMP CIRCUIT FOR COMPENSATING MISMATCH OF OUTPUT CURRENTS

TECHNICAL FIELD

The present invention relates to a charge pump circuit of a phase-locked loop, more particularly, a correcting circuit for improving speed of switching and a correcting mismatch between source current and sink current which are generated on switching time in charge pump circuit, and a charge pump circuit using thereof.

BACKGROUND OF THE INVENTION

FIG. 1 shows a block diagram of a conventional phase-locked loop.

As shown in FIG. 1, the phase-locked loop has a phase detector 101, a charge pump 103, a loop filter 105, and a voltage controlled oscillator 107. The voltage controlled oscillator 107 controls frequency of an outputted oscillation signal CLK, according to an inputted voltage signal. The phase detector 101 outputs UP and DOWN signals when the frequency of the oscillation signal CLK outputted from the voltage controlled oscillator 107 is not matched with that of a reference oscillation signal REFCLK. More specifically, the phase detector outputs the UP signal if the frequency of the oscillation signal CLK is less than that of the reference oscillation signal REFCLK, and outputs the DN signal if the frequency of the oscillation signal CLK is greater than that of the reference oscillation signal REFCLK. The charge pump 203 outputs positive current pulse in case that an applied voltage pulse is the UP signal, and outputs negative current pulse in case that the applied voltage pulse is the DN signal. Generally, the loop filter 105 comprises a large capacitor, and controls an output voltage $V_{CLT}$ by adding charge to the capasitor or removing charge from the capacitor in accordance with the inputted current pulse. The voltage controlled oscillator 107 controls the frequency of the oscillation signal CLK by the voltage Vclt outputted from the loop filter 105. That is, the frequency of the oscillation signal CLK is increased when the output voltage Vclt of the loop filter 105 is raised, and the frequency of the oscillation signal CLK is decreased when the output voltage $V_{CLT}$ of the loop filter 105 is gone down.

Accordingly, when the frequency of the oscillation signal CLK which is outputted from the voltage controlled oscillator 107 is less than the reference oscillation signal REFCLK, the phase detector 101 generates the UP signal, and the charge pump 103 charges the capacitor of the loop filter 105 by outputting the positive current pulse. Moreover, the voltage Vclt applied to the voltage controlled oscillator 107 is raised, and the frequency of the oscillation signal CLK is increased. On the other hands, when the frequency of the oscillation signal CLK which is outputted from the voltage controlled oscillator 107 is greater than the reference oscillation signal REFCLK, the phase detector 101 generates the DN signal, and the voltage $V_{CLT}$ applied to the voltage controlled oscillator 107 is gone down, and the frequency of the oscillation signal CLK is decreased.

FIG. 2 shows a circuit diagram of conventional charge pump used in the phase locked loop shown in FIG. 1.

As shown in FIG. 2, the conventional charge pump 103 comprises the first and second PMOS transistors MP21, MP22, and the first and second NMOS transistors MN21, MN22. The first PMOS and NMOS transistors MP21, MN21 are implemented by common-source transistors, and activated or inactivated by voltage pulses UPB, DN which are applied to gates thereof, respectively. The second PMOS and NMOS transistors MP22, MN22 are implemented by common-gate transistors, and constant bias voltages BIASP, BIASN are applied to gates, respectively.

Below, operation and problems of the conventional charge pump 103 are illustrated, with referring to FIG. 2.

When the UP pulse of the phase detector 101 is pulsed high, the UPB pulse of the charge pump 103 is pulsed low. Accordingly, the first PMOS transistor MP21 is activated. Tthe source of the second PMOS transistor MP22 is charged, and source voltage is raised until the gate-to-source voltage exceeds the threshold voltage. Accordingly, a source current $I_{source}$ flows from voltage source to the first and second PMOS transistors MP21, MP22, and the capacitor C21 connected to the output terminal $V_{LFO}$ is charged.

When the DN pulses is pulses high, the first NMOS transistor MN21 is activated. The source of the second NMOS transistor MN21 is discharged, and source voltage is gone down until the gate-to-source voltage exceeds the threshold voltage. Accordingly, a sink current $I_{sink}$ flows from the output terminal a charge pump circuit to the ground through the first and second NMOS transistors MN21, MN22, and the capacitor C21 is discharged.

In the conventional charge pump circuit 103, amounts of the source and sink currents $I_{source}$, $I_{sink}$ flowing to the output terminal $V_{LFO}$ is controlled by the bias voltages BIASP, BIASN which is applied to the gates of the second PMOS and NMOS transistors MP22, MN22. Generally, the bias voltages BIASP, BIASN is setted to predetermined voltages so that amounts of the source and the sink currents $I_{source}$, $I_{sink}$ are same.

However, a parasitic capacitance generated between gate and source of the second NMOS transistor MN22 drops quickly gate voltage of the second NMOS transistor MN22 which controls the sink current $I_{sink}$ when the DN signal is applied. Accordingly, the sink current $I_{sink}$ flowing the output terminal $V_{LFO}$ is not desired current. Although, voltage drop by parasitic capacitance is corrected by the biasing unit 2100, in the conventional charge pump circuit, correction time is needed. Moreover, parasitic capacitance generated from the source of the second NMOS transistor MN22 delays voltage drop of the source terminal to the ground and prevents a desired sink current Isink from flowing to the output terminal $V_{LFO}$.

On the other hand, the gate voltage of the second PMOS transistor MP22 is raised quickly by parasitic capacitance generated between gate and source of the second PMOS transistor MP22 when the UP signal is applied. Moreover, parasitic capacitance generated from the source of the second PMOS transistor MP22 delays voltage rise of source terminal to value of the voltage source, and prevents a desired source current Isource from flowing to the output terminal $V_{LFO}$.

Accordingly, the conventional charge pump circuit has problems that switching speed is low, and current mismatch generated between source and sink currents during current switching owing to parasitic capacitance. This current mismatch generates spurious tone, and deteriorates the phase noise figure of the phase-locked loop.

In order to resolve above problems, in conventional charge pump circuit 103, there are the method that increases impedance by being long the length of the first and second NMOS transistor MN21, MN22 used to CMOS charge pump, and the method that has greater impedance than general circuit by the second NMOS and PMOS transistor MN22, MP22 consisted of cascode. But, in case being long the length of element, swiching speed is slow, and in case that element is consisted of cascode, operating range of a charge pump is small. Moreover, because a output impedance can not substantially become in infinity, they have a limit in that source and sink currents is harmonized.

SUMMARY OF THE INVENTION

An object of the present invention is to provide a charge pump circuit for improving switching speed and compensating a mismatch between a source and sink currents flowing to output terminal charge.

Another object of the present invention is to provide a control circuit for controlling a compensating charge of a compensating circuit, in charge pump circuit.

Still another object of the present invention is to provide a charge pump circuit for compensating mismatch between a source and sink currents flowing to output terminal.

The other object of the present invention is to provide a chage pump circuit for getting to be indentical the source and sink currents without deteriorating the switching speed and operating range.

BRIEF DESCRIPTION OF THE DRAWINGS

FIG. 5 shows a circuit diagram of the variable gain amplifier shown in FIG. 2 according to another embodiment of the present invention.

FIG. 6 shows a circuit diagram of the variable gain amplifier shown in FIG. 2 according to another embodiment of the present invention.

DETAILED DESCRIPTION

Hereinafter, preferred embodiments of the present invention will be described in detail with reference to the attached drawings.

The First Embodiment

Figure 1:
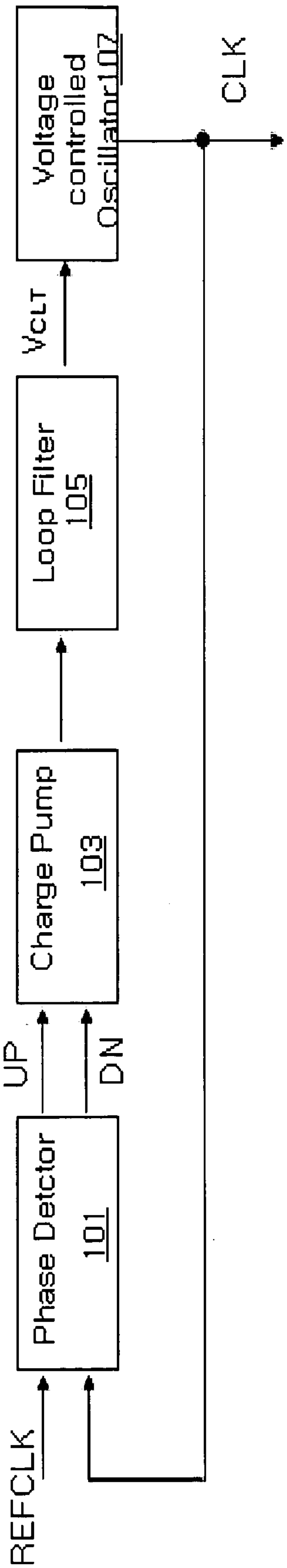
FIG. 1 shows a block diagram of a conventional phase-looked loop.
Figure 2:
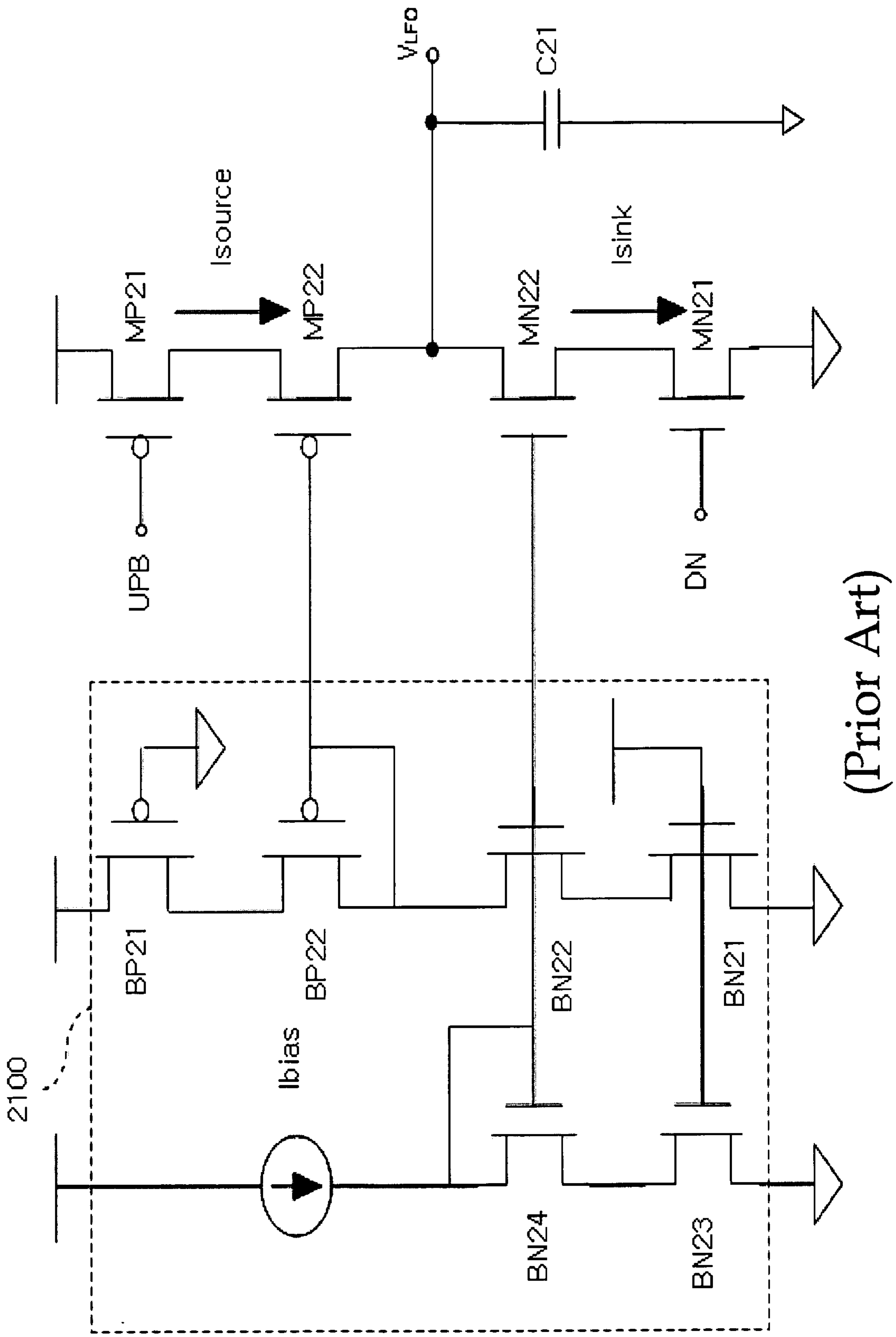
FIG. 2 shows a conventional charge pump circuit diagram in the phase-looked loop shown in FIG. 1.
Figure 3:
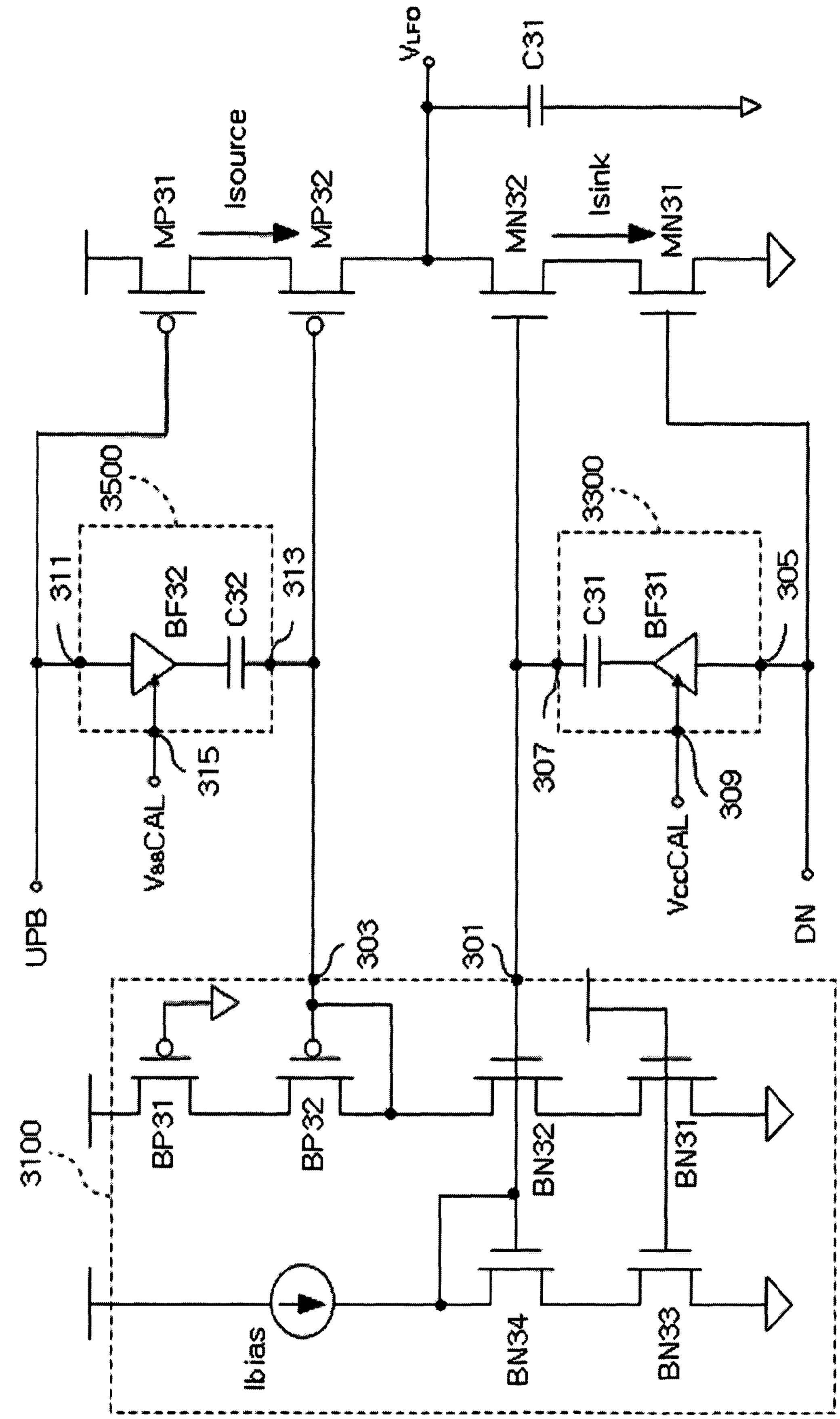
FIG. 3 shows a charge pump circuit diagram according to an embodiment of the present invention.

FIG. 3 shows a charge pump circuit diagram according to an embodiment of the present invention.

As shown in FIG. 3, the charge pump circuit diagram according to an embodiment of the present invention comprises a first and second switching elements MN31, MP31, a charging element MP32, a discharging element MN32, a biasing unit 3100, and a first and second compensating units 3300,3500.

The first and second compensating units 3300, 3500 compensates the effect according to parasitic capacitances generated between gates-sources of the discharging and charging elements MN32, MP32. In this way, the charge pump circuit shown in FIG. 3 compensates a switching speed of the charge pump circuit and a mismatch of output terminal $V_{LFO}$ current.

The first and second switching elements MN31, MP31 are activated by down and up signals DN, UPB applied to a respective gate. The charging and discharging elements MP32, Mn32 control the current which flows to the output terminal $V_{LFO}$ of the charge pump circuit by bias voltage applied to a respective gate.

The biasing unit 3100 comprises a first and second terminal 301, 302, and applies a respective bias voltage to the gate of the discharging and charging elements MN32, MP32.

The first and second compensating units 3300,3500 comprise input terminals 305,311, output terminals 307, 313, and control terminals 309, 315, and discharge and charge to the output terminals 307, 313 when down and up signals DN, UPB are applied to the input terminals 305, 311, respectively. More, The first and second compensating units 3300, 3500 control the quantity of charge of the output terminals 307, 313 by a first and second control signals VccCAL, VssCAL applied to the control terminals 309, 315, respectively.

Hereinafter, the connection of component will be described with reference to the attached FIG. 3.

The down and up signals DN, UPB are applied to the first and second switching elements MN31, MP31, respectively, and the drains are connected to the sources of the discharging and charging elements MN32, MP32, respectively, and the sources are connected to ground and power source, respectively. The gates the discharging and charging elements MN32, MP32 are connected to the first and second terminals 301, 303, respectively, the drains are connected to each other and form an output terminal $V_{LFO}$ of the charge pump circuit.

The down and up signals DN, UPB are applied to the first and second compensating units 3300, 3500, respectively, and the output terminals 307, 313 are connected to the gates of the discharging and charging elements MN32, MP32, respectively.

The composition of the charge pump circuit will be described in detail according to an embodiment of the present invention.

The biasing unit 3100 comprises a first, second, third, and fourth NMOS transistors BN31, BN32, BN33, BN34, and a first and second PMOS transistors BP31, BP32, and a bias current Ibias. The composition and operation of the biasing unit 3100 is apparent for those skilled in the art, and because the essence of the present invention is not confined to specific implementations of the biasing unit 3100, the description of the biasing unit 3100 is omitted.

The first and second compensating units 3300, 3500 comprise buffers BF31, BF32 and capasitors C31, C32, respectively. The input terminals of the buffers BF31, BF32 form the input terminals 305, 311 of the first and second compensating units 3300,3500, respectively, and the output terminals are connected to one terminal of the capacitors C31, C32, respectively. The other terminal of of the capacitors C31, C32 MN32 form the output terminals 307, 313 of the first and second compensating units 3300,3500, respectively. A high level control terminal of the buffer BF31 forms the control terminal 309 of the first compensating unit 3300, and a low level control terminal of the buffer BF32 forms the control terminal 315 of the second compensating unit 3500.

Hereinafter, the operation of the charge pump circuit according to an embodiment of the present invention will be described with reference to FIG. 3.

The first switching element MN31 is activated when the down signal DN is applied to the charge pump circuit, and the capacitor C31 connected to the output terminal $V_{LFO}$ of the charge pump circuit is discharged. That is, a sink current Isink is passed to ground through the discharging element MN32 and the first switching element MN31 from the output terminal $V_{LFO}$, the capacitor C31 is discharged. In a similar, the second switching element MN32 is activated when the up signal UPB is applied to the charge pump circuit, and the capacitor C31 connected to the output terminal $V_{LFO}$ of the charge pump circuit is charged. That is, a source current Isource is passed to the output terminal $V_{LFO}$ through the charging element MP32 and the second switching element MP31 from the power source, the capacitor C31 is charged.

In this case, as above description, the gate voltage of the discharging and charging elements MN32, MP32 is raised and dropped instantaneously by the parasitic capacitances generated between gates-sources of discharging and charging elements MN32, MP32. That is, when the up signal UPB is applied to the charge pump circuit and the source terminal voltage of the charging elements MP32 raises to a source voltage, the gate voltage of the charging elements MP32 is raised instantaneously by the parasitic capacitance generated between gate-source of the charging element MP32. On the contrary, when the down signal DN is applied to the charge pump circuit and the source terminal voltage of the discharging elements MN32 drop to ground volage, the gate voltage of the discharging elements MN32 is dropped instantaneously by the parasitic capacitance generated between gate-source of the discharging element MP32. Therefore, the rapid switching operation of the charge pump circuit is interrupted, and the mismatch of between the source current Isource and the sink current Isink is occurred.

When the down signal DN is applied to the charge pump circuit, the buffer BF31 of the first compensating unit 3300 regulates the high level voltage of the down signal DN by the first control signal VccCAL applied to the control terminal 309, and applies the regulated voltage to the capacitor C31. When a positive voltage is applied to one terminal of the capacitor C31, the capacitor C31 is discharged, and the other terminal voltage of the capacitor C31, namely, the gate voltage of the discharging element MN32 is raised.

The total charges of the parasitic capacitance and the capacitor C31 after appling of the down signal, are equal to the total charges of the parasitic capacitance and the capacitor C31 at the initial time by the law of conservation of charge. Therefore, if the first control signal VccCAL is regulated and the quantity of discharge is controlled, the voltage drop according to the parasitic capacitance and the voltage raise according to the capacitor C31 of the first compensating is offsetted each other. Consequently, the gate voltage of the discharging element MN32 is maintained uniformly.

When the up signal UPB is applied to the charge pump circuit, the buffer BF32 of the second compensating unit 3300 regulates the low level voltage of the up signal UPB by the second control signal VssCAL applied to the control terminal 315, and applies the regulated voltage to the capacitor C32. When a negative voltage is applied to one terminal of the capacitor C32, the capacitor C32 is charged, and the other terminal voltage of the capacitor C32, namely, the gate voltage of the charging element MP32 is dropped.

The total charges of the parasitic capacitance and the capacitor C32 after appling of the up signal, are equal to the total charges of the parasitic capacitance and the capacitor C32 at the initial time by the law of conservation of charge. Therefore, if the second control signal VssCAL is regulated and the quantity of charge is controlled, the voltage raise according to the parasitic capacitance and the voltage drop according to the capacitor C32 of the second compensating is offsetted each other. Consequently, the gate voltage of the charging element MP32 is maintained uniformly.

As described above, since the charge pump cuircuit according to an embodiment of the present invention have the first and second compensating units 3300, 3500, the bias voltage applied to the gates of the discharging and charging elements MN32, MP32 may be prevented the change in response to switching operation. Accordingly, the switching speed of the charge pump circuit is improved, and as the desired source and sink currents Isource, Isink passes to the output terminal $V_{LFO}$, the mismatch between currents according to the up and down signals UPB, DN may be compensated.

Figure 4:
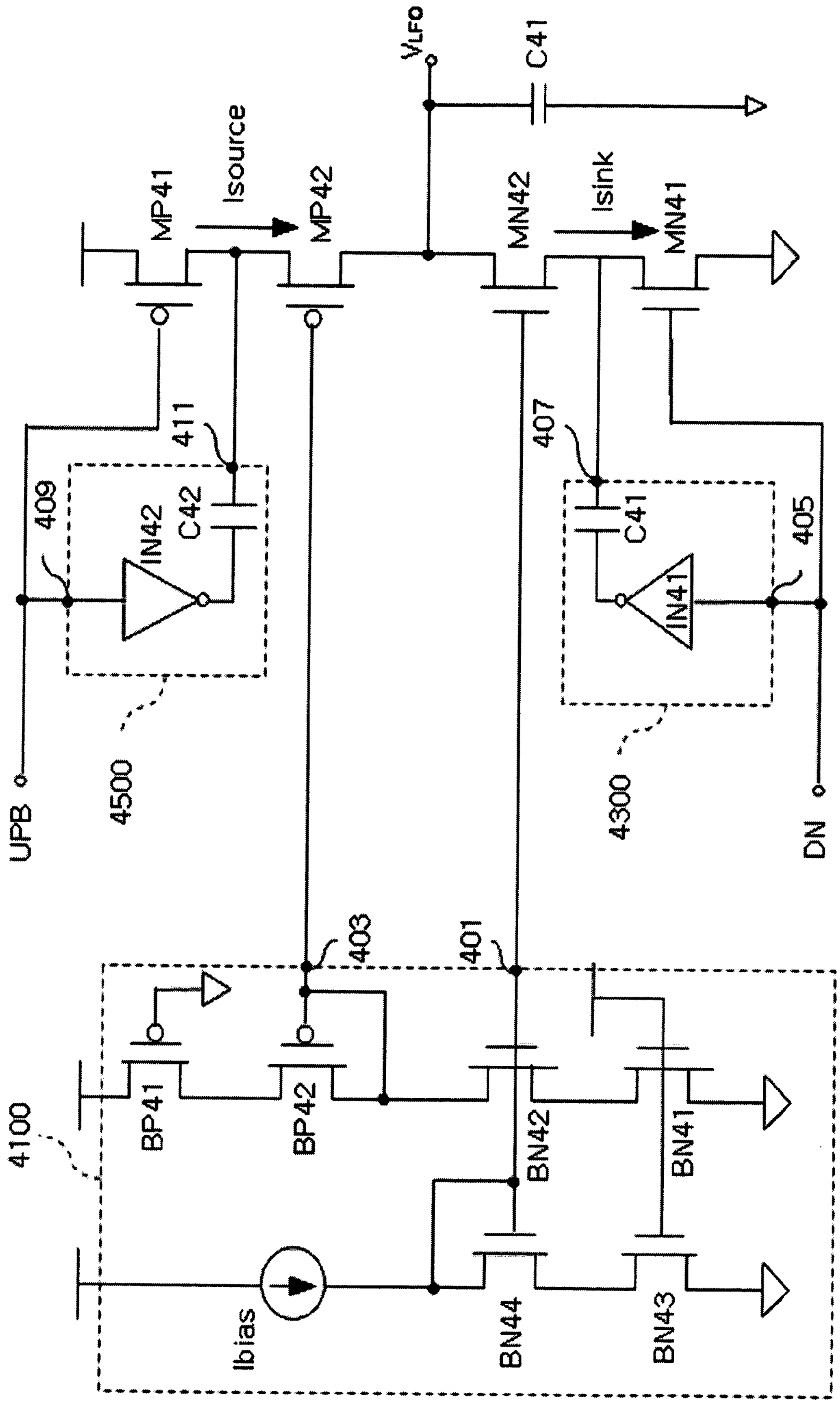
FIG. 4 shows a charge pump circuit diagram according to another embodiment of the present invention.

FIG. 4 shows a charge pump circuit according to the other embodiment of the present invention.

As shown in FIG. 4, the charge pump circuit comprises a first and second switching elements MN41, MP41, a charging element MP42, a discharging element MN42, a biasing unit 4100, and a first and second compensating units 4300, 4500.

The first and second compensating units 4300, 4500 compensates the effect according to parasitic capacitances generated between gates-sources of the discharging and charging elements MN42, MP42. In this way, the charge pump circuit shown in FIG. 4 compensates a switching speed of the charge pump circuit and a mismatch of output terminal $V_{LFO}$ current.

Below, a composition and operation of the charge pump circuit according to the other embodiment of the present invention is illustrated with referring to FIG. 4. But, the first and second switching elements MN41, MP41, the charging element MP42, the discharging element MN42, and the biasing unit 4100 are the same as the composition and operation of the charge pump circuit according to an embodiment of the present invention shown in FIG. 3, accordingly, the illustration about the composition and the operation above is omitted.

The first and second compensating units 4300, 4500 comprise input terminals 405, 409 and output terminals 407, 411, and charge or discharge to the output terminals 407, 411 by the down and up signals DN, UPB applied to the input terminals 405, 409, respectively. The down and up signals DN, UPB are applied to the input terminals 405, 409 of the first and second compensating units 4300, 4500, respectively, and the output terminals 407, 411 are connected to sources of the discharging and charging elements MN42, MP42, respectively.

The first and second compensating units 4300, 4500 comprise invertors IN41, IN42 and capacitors C41, C42, respectively. Input terminals of invertors IN41, IN42 form the input terminals 405, 409 of the first and second compensating units 4300, 4500, respectively, and output terminals are connected to one terminal of the capacitor C41, C42, respectively. The other terminal of the capacitor C41, C42 form the output terminals 407, 411 of the first and second compensating units 4300, 4500, respectively.

Hereinafter, the operation of the charge pump circuit according to the other embodiments of the present invention will be described in detail.

When the down signal DN is applied to the charge pump circuit, the first switching element MN41 is activated, a source terminal of the discharging element MN42 is dropped to grounding voltage. However, the voltage drop is delayed by the parasitic capacitance existed in the source terminal of the discharging element MN42.

When the down signal DN of a high level is applied to the input terminal 405, the invertor IN41 of the first compensating unit 4300 reverses the down signal DN, and applies a low level signal to the capacitor C41. When a negative voltage is applied to one terminal of the capacitor C41, the capacitor C41 inflows forcibly the charge from the parasitic capacitance of the source terminal of the discharging element MN42. Therefore, the source terminal of the discharging element MN42 is grounded instantaneously, and the desired a sink current Isink passes to a drain of the discharging element MN42.

When the up signal UPB is applied to the charge pump circuit, the second switching element MP41 is activated, a source terminal of the charging element MP42 is raised to source voltage. However, the voltage raise is delayed by the parasitic capacitance existed in the source terminal of the charging element MP42.

When the up signal DN of a low level is applied to the input terminal 409, the invertor IN42 of the second compensating unit 4500 reverses the up signal UPB, and applies a high level signal to the capacitor C42. When a positive voltage is applied to one terminal of the capacitor C42, the capacitor C42 emits forcibly the charge to the parasitic capacitance of the source terminal of the charging element MP42. Therefore, the source terminal of the discharging element MN42 is raised to source voltage instantaneously, and the desired a source current Isource passes to a source of the charging element MP42.

As described above, since the charge pump cuircuit according to the other embodiment of the present invention have the first and second compensating units 4300, 4500, the switching speed of the charge pump circuit can be improved, and the mismatch between source current and sink current flowing to the output terminal $V_{LFO}$ can be compensated, by removing the influence according to the parasitic capacitance existed in the source terminal of the discharging and charging elements MN42, MP42.

Figure 5:
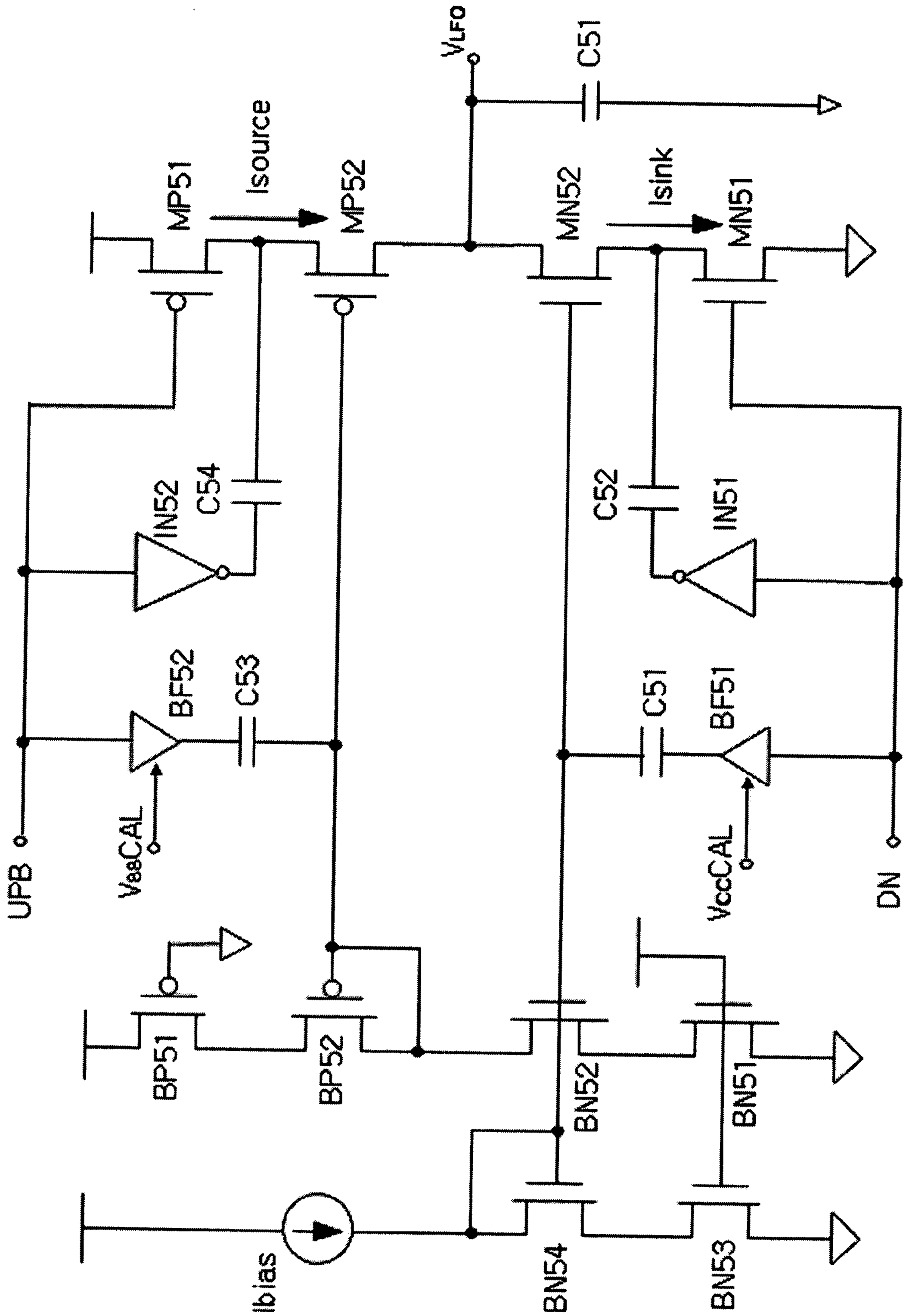
FIG. 5 shows a charge pump circuit diagram according to another embodiment of the present invention.

FIG. 5 shows a charge pump circuit according to another embodiment of the present invention.

As shown in FIG. 5, it is different from the embodiments shown FIG. 3 and FIG. 4 in that the charge pump circuit comprises the first and second compensating 3300, 3500 shown in FIG. 3 and the first and second compensating 4300, 4500 shown in FIG. 4.

As the charge pump circuit according to another embodiment of the present invention has four compensating circuits, the switching speed of the charge pump circuit can be more improved, and the mismatch between currents flowing to the output terminal $V_{LFO}$ can be more compensated, by removing the influence according to the parasitic capacitance existed in the source terminals and the gate-source terminals of the discharging and charging elements MN42, MP42 at the same time.

In the charge pump circuit shown FIG. 3 and FIG. 5, the first and second compensating units 3500, 3700 emit and flow the charge to the discharging and charging elements MN32, MP32, and remove the influence according to the parasitic capacitance exsited in the gate-source terminals of the discharging and charging elements MN32, MP32. However, in case that the compensating charge emitted or flowed from the first and second compensating units 3500, 3700 is not equal to the theoretically necessary compensating charge in order to maintain the constant gate voltage of the discharging and charging elements MN32, MP32, the mismatch between currents of the output terminal $V_{LFO}$ exists as usual. In the charge pump circuit shown FIG. 3 and FIG. 5, the voltage drop and raise by the parasitic capacitance varies according to the output voltage $V_{LFO}$, and the compensating charge varies according to the source voltage, temperature, etc. Therefore, it is necessary that controlls the compensating charge.

But, the first and second compensating units 4300, 4500 of the charge pump circuit shown in FIG. 4 are the circuits so that the source terminals of the discharging and charging elements MN42, MP42 turn into the grounding and source voltages rapidly. Consequencely, the benefit by controlling the compensating charge is not much.

Figure 6:
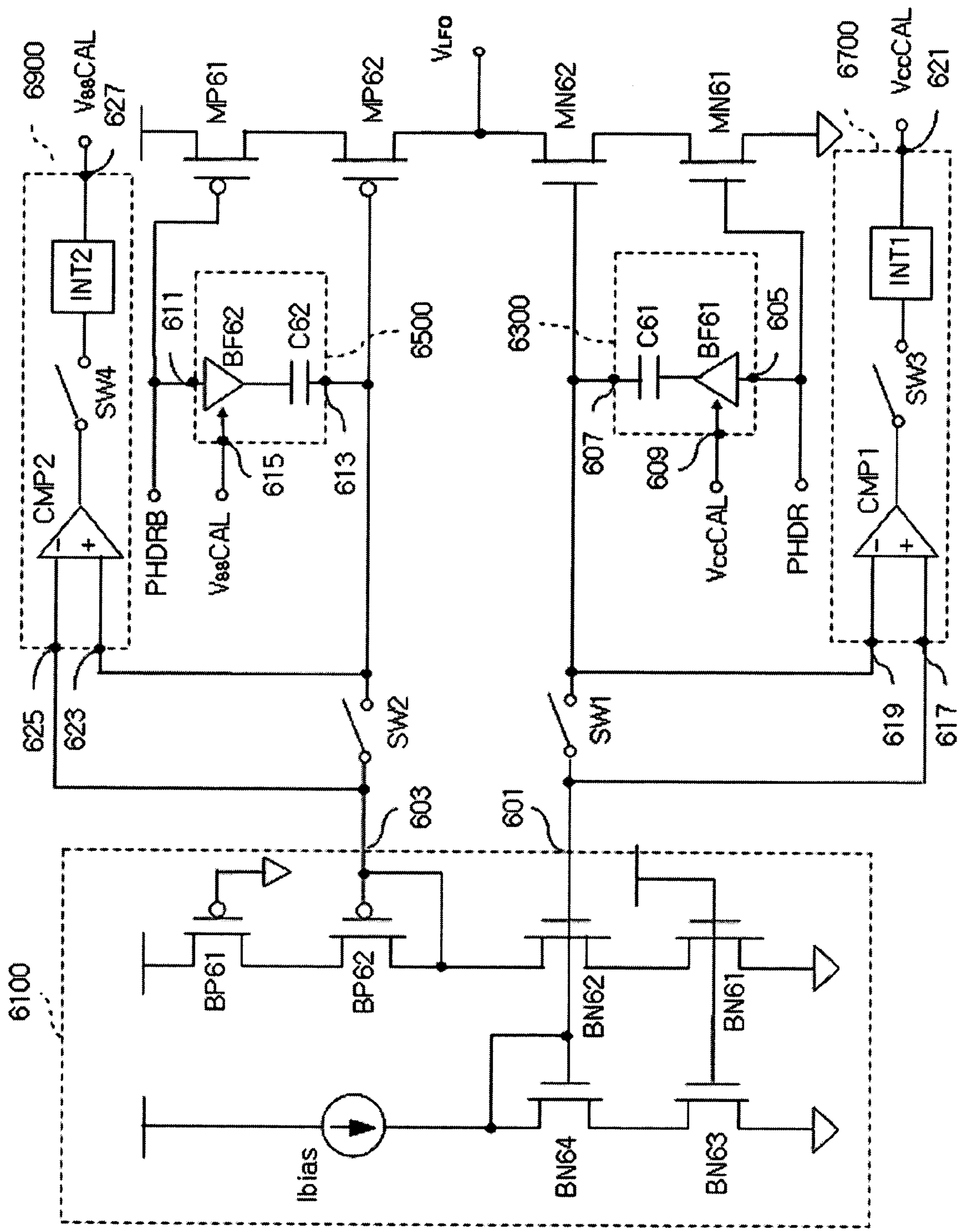
FIG. 6 shows a circuit diagram of a control circuit for contolling a quantity of compensating charge of the first and second compensating units according to an embodiment of the present invention in the charge pump circuit shown in FIG. 3.

FIG. 6 shows a control circuit diagram according to an embodiment of the present invention in order to control the compensating charge of the first and second compensating units 3300, 3500, in the charge pump circuit shown in FIG. 3.

As shown FIG. 6, the control circuit uses the equivalent circuit of the charge pump circuit according to an embodiment of the present invention shown in FIG. 3.

As shown FIG. 6, the control circuit comprises a first and second switching elements MN61, MP61, charging and discharging elements MP62, MN62, a biasing unit 6100, a first and second compensating units 6300, 6500, a first and second switch means SW1, SW2, and a first and second controlling units 6700, 6900. Also, it is preferable that a buffer (not shown) is connected to the output terminal $V_{LFO}$ of the control circuit.

Hereinafter, the relation of connection between compositions is illustrated with referring to FIG. 6

But, the first and second switching elements MN61, MP61, the charging element MP62, the discharging element MN62, the biasing unit 6100, and the first and second compensating units 6300, 6500 are the same as the composition and operation of the charge pump circuit according to an embodiment of the present invention shown in FIG. 3, accordingly, the illustration about the composition and the operation above is omitted.

The first switch means SW1 is connected to between a first terminal 601 of the biasing unit 6100 and the gate of the discharging element MN62, the second switch means SW2 is connected to between a second terminal 603 of the biasing unit 6100 and the gate of the charging element MP62.

The first controlling unit 6700 comprises a first and second input terminals 617, 619, and an output terminal 621, outputs the value which is integrated the difference between voltages applied to the first and second input terminals 617, 619. The second controlling unit 6900 comprises a first and second input terminals 623, 625, and an output terminal 627, outputs the value which is integrated the difference between voltages applied to the first and second input terminals 623, 625.

The first input terminal 617 of the first controlling unit 6700 is connected to the first terminal of the biasing unit 6100, the second input terminal 619 is connected to the gate of the discharging element MN62. Also, a output signal VccCAL of the first controlling unit 6700 is applied to control terminals 309, 609 of the first compensating units

3300, 6300 comprised in the charge pump circuit and the charge compensating control circuit.

Hereinafter, the inside composition of the first and second controlling units is illustrated in detail.

The first controlling unit 6700 comprises a comparator CMP1, a switch means SW3, an integrator INT1. +input terminal of the comparator CMP1 forms the first input terminal 617 of the first controlling unit 6700, –input terminal of the comparator CMP1 forms the second input terminal 619 of the first controlling unit 6700. The output terminal of comparator CMP1 is connected to one terminal of the switch means SW3, and the other terminal of the switch means SW3 is connected to the input terminal of the integrator INT1, and the output terminal of the integrator INT1 is connected to the output terminal 621 of the first controlling unit 6700.

The second controlling unit 6900 comprises a comparator CMP2, a switch means SW4, an integrator INT2. +input terminal of the comparator CMP2 forms the first input terminal 623 of the first controlling unit 6900, –input terminal of the comparator CMP2 forms the second input terminal 625 of the second controlling unit 6900. The output terminal of comparator CMP2 is connected to one terminal of the switch means SW4, and the other terminal of the switch means SW4 is connected to the input terminal of the integrator INT2, and the output terminal of the integrator INT2 is connected to the output terminal 627 of the first controlling unit 6900.

Hereinafter, the operation of the control circuit according to an embodiment of the present invention shown in FIG. 6 is illustrated in detail.

In the control circuit, the operation of a sink terminal is illustrated first of all. In the initial state, the switch first means SW1 is shorted and the target bias voltage is applied to a gate of the discharging element MN62. In the second place, the first switch means is opened, and a first signal PHDR is applied to the charge pump circuit. As described above, if the first signal PHDR is applied, the gate voltage of the discharging element MN62 is dropped instantaneously by the parasitic capacitance between gate-source of the discharging element MN62, and the capacitor C61 of the first compensating unit 6300 emits the charge in order to compensate that. However, in case that the charge quantity emitted from the first compensating unit 6300 is not equal to the theoretically necessary compensating charge, consequently, the gate voltage of the discharging element MN62 is not in keeping with the voltage outputted to the first terminal 601 of the biasing unit 6100.

The comparator CMP1 of the first controlling unit 6700 compares the voltage of the first terminal 601 of the biasing unit 6100 applied to +input terminal and the voltage of gate of the discharging element MN62 applied to +input terminal, and the difference of both voltages is outputted. The integrator INT1 integrates the output valve outputted from the comparator CMP1, and outputs integrated value to the first control signal VccCAL. The first control signal VccCAL is applied to the control terminal 309, 609 of the first compensating units 3300, 6300 of the control circuit and the charge pump circuit, and regulates a high level voltage Vcc of buffer BF31, BF61. Therefore, the compensating charge quantity emitted from the capacitor C31, C61 are regulated by controlling the voltage applied to the capacitor C31, C61. That is, in case that the compensating charge is not enough and the gate voltage of the discharging element MN62 is lower than a target voltage, the emitted compensating charge is increased by raising the voltage of the first control signal VccCAL. The other way, in case that the compensating charge is ever so much and the gate voltage of the discharging element MN62 is higher than a target voltage, the emitted compensating charge is decreased by dropping the voltage of the first control signal VccCAL.

In the control circuit, the operation of a source terminal is as well as the sink terminal. In the initial state, the second switch means SW2 is shorted and the target voltage is applied to a gate of the charging element MP62. In the second place, the second switch means is opened, and a second signal PHDRB is applied to the charge pump circuit. As described above, if the second signal PHDRB is applied, the gate voltage of the charging element MP62 is raised instantaneously by the parasitic capacitance between gate-source of the charging element MP62, and the capacitor C62 of the second compensating unit 6500 flows the charge in order to compensate that. However, in case that the charge quantity flowed into the second compensating unit 6500 is not equal to the theoretically necessary compensating charge, consequently, the gate voltage of the charging element MP62 is not in keeping with the voltage outputted to the second terminal 603 of the biasing unit 6100.

The comparator CMP2 of the second controlling unit 6900 compares the voltage of the second terminal 603 of the biasing unit 6100 applied to +input terminal and the voltage of gate of the charging element MP62 applied to +input terminal, and the difference of both voltages is outputted. The integrator INT2 integrates the output valve outputted from the comparator CMP2, and outputs integrated value to the second control signal VssCAL. The second control signal VssCAL is applied to the control terminal 315, 615 of the second compensating units 3500, 6500 of the control circuit and the charge pump circuit, and regulates a low level voltage Vss of buffer BF32, BF62. Therefore, the compensating charge quantity emitted from the capacitor C32, C62 are regulated by controlling the voltage applied to the capacitor C32, C62. That is, in case that the compensating charge is not enough and the gate voltage of the charging element MP62 is higher than a target voltage, the flowed compensating charge is increased by dropping the voltage of the second control signal VssCAL. The other way, in case that the compensating charge is ever so much and the gate voltage of the charging element MP62 is lower than a target voltage, the flowed compensating charge is decreased by raising the voltage of the second control signal VssCAL.

The control circuit shown in FIG. 6 is implemented by using the equivalent circuit of the control circuit shown in FIG. 3. Moreover, the charge pump circuit can be implemented by using the equivalent circuit of the control circuit shown in FIG. 5 or by using the equivalent circuit of the changed control circuit of that. The idea of the present invention is not confined to the specific control circuit, and this is apparent for those skilled in the art.

The Second Embodiment

Figure 7:
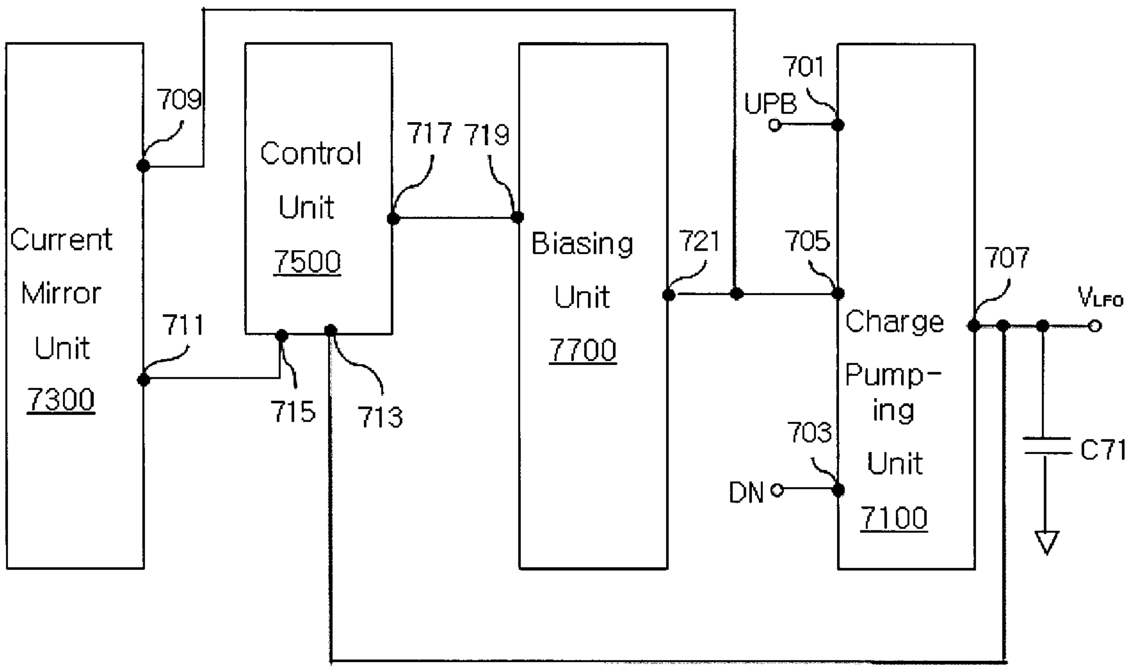
FIG. 7 shows a charge pump circuit diagram according to another embodiment of the present invention.

FIG. 7 shows a charge pump circuit diagram according to an embodiment of the present invention summarily.

As shown FIG. 7, the charge pump circuit comprises a charge pumping unit 7100, a current mirror unit 7300, a control unit 7500, and a biasing unit 7700.

The charge pumping unit 7100 has a first and second input terminals 701, 703, a bias terminal 705, and an output terminal 707, charges and discharges a capacitor C71 connected to the output terminal 707 by up and down signals applied to the first and second input terminals 701, 703, respectively. Moreover, the current quantity flowed to the output terminal 707 of the charge pumping unit 7100 control by the voltage applied to the bias terminal 705. The current mirror unit 7300 has a bias terminal 709 and an output terminal 711, takes the current flowed to the output terminal 707. In addition to, the current mirror unit 7300 controls the voltage of the output terminal 707 by the voltage applied to the bias terminal 709. The control unit 7500 has a first and second input terminals 713, 715 and an output terminal 717, and controls the quantity of a control current Icomp flowed to the output terminal 717 by the differential voltage between the first and second input terminals 713, 715. The biasing unit comprises a control terminal 719 and an output terminal 721, controls the output voltage by the control current Icomp applied to the control terminal 719.

Hereinafter, the relation of connection between compositions is illustrated with referring to FIG. 7

The up and down signals UPB, DN are applied to the first and second input terminals 701, 703 of the charge pumping unit 7100, the bias terminal 705 is connected to the output terminal 721 of the biasing unit 7700. The output terminal 707 is connected to the capacitor C71 and is more connected to the first input terminal 713 of the controlling unit 7500.

The bias terminal 709 of the current mirror unit 7300 is connected to the output terminal 721 of the biasing unit 7700, the output terminal 711 is connected to the second input terminal 715 of the controlling unit 7500.

The output terminal 717 of the controlling unit 7500 is connected to the control terminal 719 of the biasing unit 7700.

Figure 8:
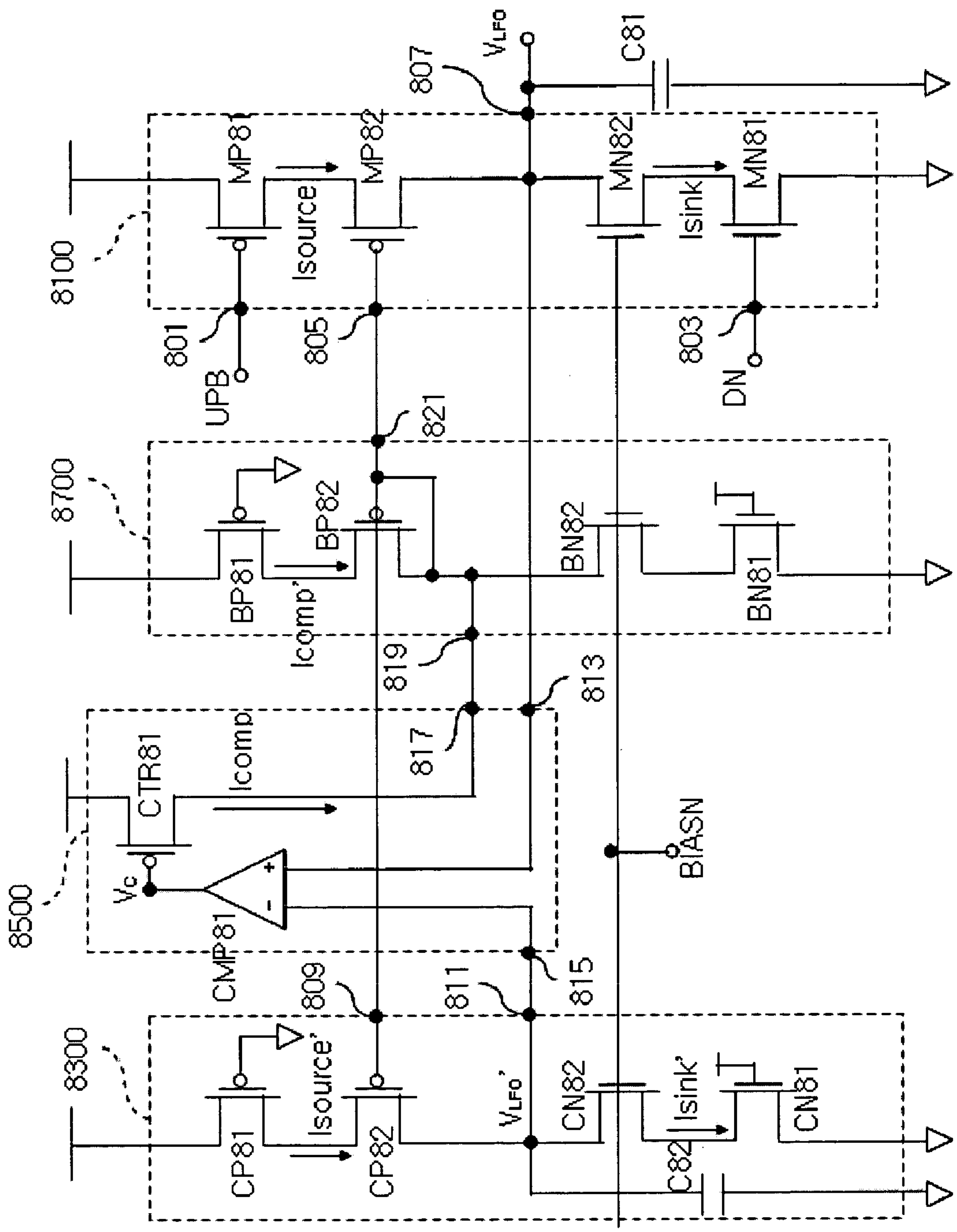
FIG. 8 shows a charge pump circuit diagram shown in FIG. 7 used practical emements according to an embodiment of the present invention.

FIG. 8 shows the charge pump circuit diagram which is used actual elements according to an embodiment of the present invention in FIG. 7.

The charge pump circuit is implemented by MOSFET transistor amplifying element. The amplifying element has a gate, a source, and a drain. The MOSFET transistor has a characteristic which determines the quantity and direction of current (flows from a drain to a source or that inversely) according to the level and polarity of voltage applied to the gate. This sort of amplifying element is Bipolar Junction Transistor (BJT), Junction Field Effect Transistor (JFET), Metal-Oxide-Semiconductor Field Effect Transistor (MOSFET), Metal-Semiconductor Field Effect Transistor (MESFET).

Hereinafter, the charge pump circuit will be illustrated in priority MOSFET. However, the idea of the present invention can be applied not only MOSFET but also all sort of complementary elements. Therefore, the conception and range of the present invention is not confined to MOSFET. In addition to, hereinafter, the charge pump circuit will be illustrated in priority N type MOSFET, but P type MOSFET can be applied to the circuit as apparent for those skilled in the art.

As shown in FIG. 8, the charge pump circuit compensates the mismatch between currents of the output terminal 807 of the charge pumping unit 8100 by compensating the mismatch between an output voltage $V_{LFO}$ of the charge pumping unit 8100 and an output voltage $V_{LFO}'$ of the current mirror unit 8300 at the source terminal.

The charge pumping 8100 comprises a first and second PMOS transistor MP81, MP82, and a first and second NMOS transistor MN81, MN82. The gates of the first PMOS and NMOS transistors MP81, MN81 form a first and second input terminals 801, 803 of the charge pumping unit 8100, respectively, the drains of the first PMOS and NMOS transistors MP81, MN81 are connected to the sources of the second PMOS and NMOS transistors MP82, MN82, respectively. The sources of the first PMOS and NMOS transistors MP81, MN81 are connected to power source and ground, respectively. A gate of the second PMOS transistor MP82 forms the bias terminal 805 of the charge pumping unit 8100, and a drain of the second PMOS transistor MP82 is connected to a gate of the second NMOS transistor MN82 and forms the output terminal 807 of the charge pumping unit 8100. The gate of the second NMOS transistor MN82 is applied to the predetermined constant N type bias voltage BIASN so that a sink current is identical to a source current flowing to the second PMOS transistor MP82.

The current mirror unit 8300 comprises a first and second PMOS transistors CP81, CP82, and a first and second NMOS transistors CN81, CN82, and a capacitor C82. The gates of the first PMOS and NMOS transistors CP81, CN81 are connected to ground and power source, respectively, and the drains of the first PMOS and NMOS transistors CP81, CN81 are connected to the sources of the second PMOS and NMOS transistors CP82, CN82, respectively, and the sources of the first PMOS and NMOS transistors CP81, CN81 are connected to power source and ground, respectively. A gate of the second PMOS transistor CP82 forms the bias terminal 809 of the current mirror unit 8300, and a drain of the second PMOS transistor CP82 is connected to a drain of the second NMOS transistor CN82 and forms the output terminal 811 of the current mirror unit 8300. The gate of the second NMOS transistor CN82 is applied to the predetermined constant N type bias voltage BIASN, and the capacitor C82 is connected to between the connecting point of the second PMOS and NMOS transistors CP82, CN82 and the ground. The current mirror unit 8300 can be implemented by current mirror circuit the so-called, the idea of the present invention is not confined to specific implementations of the current mirror unit 8300, as apparent for those skilled in the art.

The control unit 8500 comprises a comparator CMP81 and a PMOS transistor CTR81. ±input terminals of the comparator CMP81 form the first and second input terminals 813, 815 of the control unit 8500, respectively, and an output terminal of the comparator CMP81 is connected to a gate of the PMOS transistor CTR81. A source of the PMOS transistor CTR81 is connected to power source, and a drain of the PMOS transistor CTR81 forms the output terminal of the control unit 8500.

The biasing unit 8700 comprises a first and second PMOS transistors BP81, BP82, and a first and second NMOS transistors BN81, BN82. The gates of the first PMOS and NMOS transistors BP81, BN81 are connected to ground and power source, respectively, and the drains of the first PMOS and NMOS transistors BP81, BN81 are connected to the sources of the second PMOS and NMOS transistors BP82, BN82, respectively, and the sources of the first PMOS and NMOS transistors BP81, BN81 are connected to power source and ground, respectively. A gate of the second PMOS transistor BP82 forms the output terminal 821 of the biasing unit 8700, and a drain of the second PMOS transistor BP82 is connected to a drain of the second NMOS transistor BN82 and forms the control terminal 819 of the biasing unit 8700. The gate and drain of the second PMOS transistor BP82 is connected to each other, and the constant N type bias voltage BIASN is applied to the gate of the second NMOS transistor BN82.

Hereinafter, the operation of the charge pump circuit according to an embodiment of the present invention will be illustrated with referring to FIG. 8.

The charge pump circuit has the current mirror unit 8300 which takes a source current Isource and a sink current Isink of the charge pumping unit 8100. The charge pump circuit detects the difference in voltage between the output terminal voltage $V_{LFO}$ of the charge pumping unit 8100 and the output terminal voltage $V_{LFO}$' of the current mirror unit 8300, and then feeds the dectected voltage by negative feedback circuit. And the charge pump circuit controls the difference in voltage between the output terminal 807 of the charge pumping unit 8100 and the output terminal 811 of the current mirror unit 8300 by varying the current flowed to the control terminal 819 of the biasing unit 8700 in accordance with the negative feedback signal.

The charge pumping unit 8100 charges and discharges the capacitor C81 connected to the output terminal 807 by the up and down signals UPB, DN applied to the first and second input terminals, respectively. That is, when the up signal UPB is applied, the first PMOS transistor MP81 is activated and the source current Isource flows from power source to the output terminal 807 via the first and second PMOS transistors MP81, MP82. Consequently, the capacitor C81 connected to the output terminal 807 of the charge pumping unit 8100 is charged. When the down signal DN is applied, the first NMOS transistor MN81 is activated and the sink current Isink flows from the output terminal 807 to the ground via the first and second NMOS transistors MN81, MN82. Consequently, the capacitor C81 connected to the output terminal 807 of the charge pumping unit 8100 is discharged. In addition to, the quantity of the source current Isource and the sink current Isink are determined by the bias voltage applied to the gate of the second PMOS and NMOS transistors MP82, MN82, and the bias voltage is setted up so that the source current Isource is identical to the sink current Isink at the initial state. However, as above described, there is the problem that the source current Isource is not identical to the sink current Isink on account of the non-ideal output impedance of output drive element.

The current mirror unit 8300 takes the current flowed to the output terminal 807 of the charge pumping unit 8100, and controls the voltage $V_{LFO}$' by the voltage applied to the bias terminal 809. That is, the gate of the second PMOS transistor CP82 of the current mirror unit 8300 is connected to the output terminal 821 of the biasing unit 8700, and is applied to the voltage that is substantially identical to the bias voltage applied to the gate of the second PMOS transistor MP82 of the charge pumping unit 8100, and the gate of the second NMOS transistor MN82 of the current mirror unit 8300 is applied to the voltage that is substantially identical to the bias voltage BIASN applied to the gate of the second NMOS transistor MN82 of the charge pumping unit 8100. Therefore, in case that the output voltage of the charge pumping unit 8100 is substantially identical to the output voltage $V_{LFO}$' of the current mirror unit 8300, when the up signal UPB is applied, the first current Isource' which is identical to the source current Isource flowing to the second PMOS transistor CP82 of the charge pumping unit 8100 flows to the second PMOS transistor CP82 of the current mirror unit 8300, when the down signal DN is applied, the second current Isink' which is identical to the sink current Isink flowing to the second NMOS transistor CN82 of the charge pumping unit 8100 flows to the second NMOS transistor CN82 of the current mirror unit 8300. Moreover, if the bias voltage applied to the bias terminal 809 of the current mirror unit 8300 is increased, the first current Isource' flowing to the second PMOS transistor CP82 is decreased, and the output voltage $V_{LFO}$' is decreased, on the contrary, if the bias voltage applied to the bias terminal 809 of the current mirror unit 8300 is decreased, and the output voltage $V_{LFO}$' is increased.

The control unit 8500 compares the voltage applied to the first and second input terminals 813, 815, and controls the current Icomp flowing to the output terminal 817 by above the differential voltage. The comparator CMP81 of the control unit 8500 compares the output voltage $V_{LFO}$ of the charge pumping unit 8100 applied to +input terminal and the output voltage $V_{LFO}$ of the current mirror unit 8300 applied to −input terminal, and then controls the output voltage Vc. That is, in case that the output voltage $V_{LFO}$ of the charge pumping unit 8100 is lower than the output voltage $V_{LFO}$' of the current mirror unit 8300, the voltage Vc is decreased, in case the contrary, the voltage Vc is increased. The PMOS transistor CRT81 of the control unit 8500 controls the current Icomp flowing to the output terminal 817 of the control unit 8500 by the voltage Vc applied to the gate. That is, when the control voltage Vc applied to the gate of the PMOS transistor CRT81 is decreased, the current Icomp is increased, when the control voltage Vc is increased, the current Icomp is decreased.

The biasing unit 8700 provides the gates of the second PMOS transistors MP82, CP82 of the charge pumping unit 8100 and the current mirror unit 8300 with the bias voltage, and controls the voltage of the output terminal 821 in proportion to the current control signal Icomp flowed to the control terminal 819. That is, when the current Icomp is decreased, the current Icomp' flowing to the first and second PMOS transistors BP81, BP82 is increased. On the contrary, when the current Icomp is increased, the the current Icomp' flowing to the first and second PMOS transistors BP81, BP82 is decreased, and the output voltage of the biasing unit 8700 is increased.

In the charge pump circuit according to an embodiment of the present invention, the source current Isource and sink current Isink of the charge pumping unit 8100 is not identical according to the output voltage $V_{LFO}$, the mismatch of this sort gives rise to the mismatch between the first current Isource' and second current Isink' of the current mirror unit 8300. Therefore, the mismatch between the output voltage $V_{LFO}$ of the charge pumping unit 8100 and the output voltage $V_{LFO}$' of the current mirror unit 8300 is occurred. The control unit 8500 detects the mismatch of this sort, and compensates the mismatch between the output voltage $V_{LFO}$ of the charge pumping unit 8100 and the output voltage $V_{LFO}$' of the current mirror unit 8300 by regulating the control current Icomp flowed to the control terminal 819 of the biasing unit 8700.

Hereinafter, the operation of the charge pump circuit according to an embodiment of the present invention is illustrated in detail.

When the output voltage $V_{LFO}$ of the charge pumping unit 8100 is lower than the output voltage $V_{LFO}$' of the current mirror unit 8300, the current Icomp is increased by the control unit 8500. When the current Icomp is increased, the output voltage is increased by the biasing unit 8700. Therefore, the bias voltage applied to the bias terminal of the current mirror unit 8300 is increased, and the output voltage $V_{LFO}$' of the current mirror unit 8300 is decreased. At this time, the bias voltage applied to the bias terminal 805 of the charge pumping unit 8100 is increased, but the source terminal of the charge pumping unit 8100 is operated only in case that the up signal UPB is applied and the capacitor C71 of large capacity is connected to the output terminal 807, and so the output voltage $V_{LFO}$ is not substantially affected. After all, the output voltage $V_{LFO}$' of the current mirror unit 8300 is substantially identical to the output voltage $V_{LFO}$ of the charge pumping unit 8100, and the mismatch between the source current Isource and the sink current Isink is compensated.

On the contrary, when the output voltage $V_{LFO}$ of the charge pumping unit 8100 is higher than the output voltage $V_{LFO}$' of the current mirror unit 8300, the current Icomp is decreased by the control unit 8500. When the current Icomp is decreased, the output voltage is decreased by the biasing unit 8700. Therefore, the bias voltage applied to the bias terminal of the current mirror unit 8300 is decreased, and the output voltage $V_{LFO}$' of the current mirror unit 8300 is increased. After all, the output voltage $V_{LFO}$' of the current mirror unit 8300 is substantially identical to the output voltage $V_{LFO}$ of the charge pumping unit 8100, and the mismatch between the source current Isource and the sink current Isink is compensated.

In the charge pump circuit according to an embodiment of the present invention, when the mismatch between the source current Isource and the sink current Isink is occurred, the difference between the output voltage $V_{LFO}$ of the charge pumping unit 8100 and the output voltage $V_{LFO}$ of the current mirror unit 8300 is occurred. Because the difference of this sort is detected and compensated by the control unit 8500, the mismatch between the source current Isource and the sink current Isink is compensated.

Figure 9:
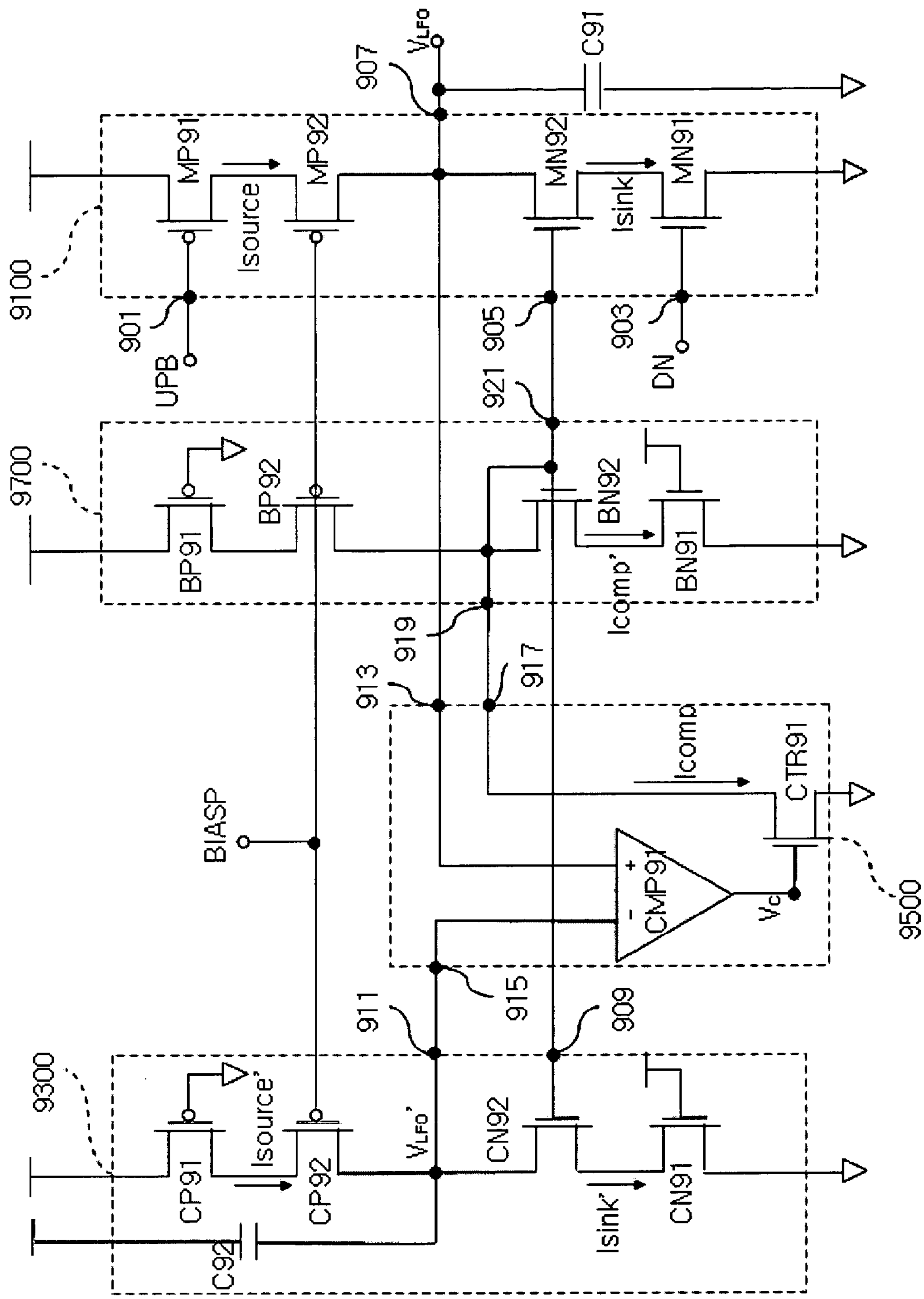
FIG. 9 shows a charge pump circuit diagram shown in FIG. 7 used practical emements according to another embodiment of the present invention.

FIG. 9 shows the charge pump circuit diagram which is used actual elements according to an embodiment of the present invention in FIG. 7.

As shown FIG. 9, the charge pump circuit compensates the mismatch of an output terminal 907 current of a charge pumping unit 9100 by compensating the mismatch between the output voltage $V_{LFO}$ of the charge pumping unit 9100 and the output voltage $V_{LFO}$' of the current mirror unit 9300.

Hereinafter, the composition of the charge pump circuit according to the other embodiment of the present invention will be illustrated with referring to FIG. 9. But, the parts that are identical with the charge pump circuit according to an embodiment of the present invention are emitted, and the points of difference are illustrated.

In a charge pumping unit 9100, the gates of a first PMOS and NMOS transistors MP91, MN91 form a first and second input terminals 901, 903, and the gates of a second NMOS transistor MN92 forms a bias terminal of the charge pumping unit 9100. Gates of a second PMOS transistor is applied to the predetermined constant P type bias voltage BIASP so that a source current Isource is identical to a sink current Isink flowing to the second NMOS transistor MN92. Drains of a second PMOS and NMOS transistors MP92, MN92 are connected to each other, and form the output terminal 907.

In a current mirror unit 9300, the constant P type bias voltage BIASP is applied to a gate of a second PMOS transistor CP92, and a gate of a second NMOS transistor CN92 forms a bias terminal 909, and drains of a second PMOS and NMOS transistors CP92, CN92 are connected to each other, and form the output terminal 911. A capacitor C92 is connected to between the connection point of the drains of the second PMOS and NMOS transistors C092, CN92 and power source.

A control unit 9500 comprises a comparator CMP91 and a NMOS transistor CTR91. +input terminal of the comparator CMP91 forms a first input terminal of the control unit 9500, −input terminal of the comparator CMP91 forms a second input terminal of the control unit 9500, An output terminal of the comparator CMP91 is connected to a gate of the NMOS transistor CTR91. A drain of the NMOS transistor CTR91 forms a output terminal 917 of the control unit 9500, a drain of the NMOS transistor CTR91 is grounded.

In a biasing unit 9700, the constant P type bias voltage BIASP is applied to a gate of a second PMOS transistor BP92, and a gate of a second NMOS transistor BN92 forms an output terminal 921. A drain and gate of the second NMOS transistor BN92 are connected to each other, and drains of the second PMOS and NMOS transistors BP92, BN92 are connected to each other and form the control terminal 919.

Hereinafter, the operation of the charge pump circuit according to the other embodiment of the present invention will be illustrated in detail with referring to FIG. 9.

When the output voltage $V_{LFO}$ of the charge pumping unit 9100 is lower than the output voltage $V_{LFO}$' of the current mirror unit 9300, the control voltage Vc is decreased as well as the difference of both voltages by the comparator CMP91 of the control unit 9500. When the control voltage Vc is decreased, and the output current Icomp of the control unit 9500 is decreased by the NMOS transistor CTR91, and a current Icomp' flowing to the second NMOS transistor BN92 of the biasing unit 9700 is increased. And then, when the current Icomp' is increased, the gate voltage of the second NMOS transistor BN92 is increased. As a result of this, the bias voltage applied to the bias terminal 909 of the current mirror 9300 is increased. Therefore, the second current Isink' of the current mirror 9300 is increased, and the output voltage $V_{LFO}$' is decreased. Finally, the output voltage $V_{LFO}$' of the current mirror unit 9300 get to be substantially identical to the output voltage $V_{LFO}$ of the charge pumping unit 9100.

When the output voltage $V_{LFO}$ of the charge pumping unit 9100 is higher than the output voltage $V_{LFO}$' of the current mirror unit 9300, on the same principle as above, the bias voltage applied to the bias terminal 909 of the current mirror unit 9300 is decreased. Finally, the output voltage $V_{LFO}$' of the current mirror unit 9300 get to be substantially identical to the output voltage $V_{LFO}$ of the charge pumping unit 9100.

INDUSTRIAL APPLICABILITY

According to a first embodiment of the present invention, the switching speed of a charge pump circuit can be improved and a mismatch between currents of an output terminals can be compensated, by adding a first and second compensating circuits and removing a deterioration owing to a parasitic capacitance.

Moreover, a compensating charge of the first and second compensating circuits can be exactly controlled by adding the first and second compensating circuits.

According to a second embodiment of the present invention, a mismatch between currents of the output terminals can be compensated by adding a current mirror circuit and a control circuit, and feeding an output voltage of the charge pump circuit in negative feedback.

Moreover, a source and sink currents get to be identical without deteriorating a switching speed and operating range.

What is claimed is:

1. A charge pump circuit comprising:

a charge pumping unit having first and second input terminals, a bias terminal, and an output terminal, said charge pumping unit charging and discharging a capacitor connected to said output terminal, and setting up the current flowing to said output terminal in response to bias voltage applied to said bias terminal of said charge pumping unit;

a current mirror unit having a bias terminal and an output terminal, said current mirror receiving a current flowing to said output terminal of said charge pumping unit, and controlling a voltage of said output terminal in response to bias voltage applied to said bias terminal of said current mirror unit;

a control unit having a first input terminal connected to said output terminal of said charge pumping unit, a second input terminal connected to said output terminal of said circuit mirror unit, and an output terminal, said control unit controlling a control current flowing to said output terminal of said control unit in response to a difference of voltage between said first and said second input terminals of said control unit, and a biasing unit having a control terminal connected to said output terminal of said control unit, an output terminal connected to said bias terminal of said charge pumping unit and said bias terminal of said current mirror unit, and controlling a voltage of said output terminal of said biasing unit in response to said control current flowing to said control terminal of said biasing unit.

2. The A charge pump circuit comprising:

a charge pumping unit having first and second input terminals, a bias terminal, and an output terminal, said charge pumping unit charging and discharging a capacitor connected to said output terminal, and setting up the current flowing to said output terminal in response to bias voltage applied to said bias terminal of said charge pumping unit, said charge pumping unit including first and second PMOS transistors and first and second NMOS transistors, gates of said first PMOS and NMOS transistors respectively forming said first and second input terminals of said charge pumping unit, drains of said first PMOS and NMOS transistors being respectively connected to sources of said second PMOS and NMOS transistors, sources of said first PMOS and NMOS transistors being respectively connected to a power source and a ground, and a gate of said second PMOS transistor forming said bias terminal of said charge pumping unit and being connected to said biasing unit and forming said output terminal of said charge pumping unit, a constant N type bias voltage being applied to a gate of said second NMOS transistor;

a current mirror unit having a bias terminal and an output terminal, said current mirror receiving a current flowing to said output terminal of said charge pumping unit, and controlling a voltage of said output terminal in response to bias voltage applied to said bias terminal of said current mirror unit;

a control unit having a first input terminal connected to said output terminal of said charge pumping unit, a second input terminal connected to said output terminal of said circuit mirror unit, and an output terminal, said control unit controlling a control current flowing to said output terminal of said control unit in response to a difference of voltage between said first and said second input terminals of said control unit; and a biasing unit having a control terminal connected to said output terminal of said control unit, an output terminal connected to said bias terminal of said charge pumping unit and said bias terminal of said current mirror unit, and controlling a voltage of said output terminal of said biasing unit in response to said control current flowing to said control terminal of said biasing unit.

3. A charge pump circuit comprising:

a charge pumping unit having first and second input terminals, a bias terminal, and an output terminal, said charge pumping unit charging and discharging a capacitor connected to said output terminal, and setting up the current flowing to said output terminal in response to bias voltage applied to said bias terminal of said charge pumping unit;

a current mirror unit having a bias terminal and an output terminal, said current mirror receiving a current flowing to said output terminal of said charge pumping unit, and controlling a voltage of said output terminal in response to bias voltage applied to said bias terminal of said current mirror unit, said current mirror unit including first and second PMOS transistors and first and second NMOS transistors, gates of said first PMOS and NMOS transistors being respectively connected to ground and power sources, drains of said first PMOS and NMOS transistors being respectively connected to sources of said second PMOS and NMOS transistors, sources of said first PMOS and NMOS transistors being respectively connected to a power source and a ground, and said gate of said second PMOS transistor forming said bias terminal of said current mirror unit, and said drain of said second PMOS transistor being connected to said drain of said second NMOS transistor and forming said output terminal of said current mirror unit, said N type bias voltage being applied to said gate of said second NMOS transistor;

a control unit having a first input terminal connected to said output terminal of said charge pumping unit, a second input terminal connected to said output terminal of said circuit mirror unit, and an output terminal, said control unit controlling a control current flowing to said output terminal of said control unit in response to a difference of voltage between said first and said second input terminals of said control unit; and a biasing unit having a control terminal connected to said output terminal of said control unit, an output terminal connected to said bias terminal of said charge pumping unit and said bias terminal of said current mirror unit, and controlling a voltage of said output terminal of said biasing unit in response to said control current flowing to said control terminal of said biasing unit.

4. The charge pump circuit according to claim 1, wherein said control unit has ±input terminals that form said first and second input terminals of said control unit, and includes a comparator to control a voltage of said output terminal by a difference of the voltage applied to said ±input terminals and a PMOS transistor, and a source of said PMOS transistor is connected to power source, and a gate of said PMOS transistor is connected to said output terminal of said comparator, and a drain of said PMOS transistor forms said output terminal of said control unit.

5. A charge pump circuit comprising:

a charge pumping unit having first and second input terminals, a bias terminal, and an output terminal, said charge pumping unit charging and discharging a capacitor connected to said output terminal, and setting up the current flowing to said output terminal in response to bias voltage applied to said bias terminal of said charge pumping unit;

a current mirror unit having a bias terminal and an output terminal, said current mirror receiving a current flowing to said output terminal of said charge pumping unit, and controlling a voltage of said output terminal in response to bias voltage applied to said bias terminal of said current mirror unit;

a control unit having a first input terminal connected to said output terminal of said charge pumping unit, a second input terminal connected to said output terminal of said circuit mirror unit, and an output terminal, said control unit controlling a control current flowing to said output terminal of said control unit in response to a difference of voltage between said first and said second input terminals of said control unit; and a biasing unit having a control terminal connected to said output terminal of said control unit, an output terminal connected to said bias terminal of said charge pumping unit and said bias terminal of said current mirror unit, and controlling a voltage of said output terminal of said biasing unit in response to said control current flowing to said control terminal of said biasing unit, said biasing unit including first and second PMOS transistors and first and second NMOS transistors, and gates of said first PMOS and NMOS transistors being respectively connected to ground and power sources, drains of said first PMOS and NMOS transistors being respectively connected to sources of said second PMOS and NMOS transistors, and sources of said first PMOS and NMOS transistors being respectively connected to a power source and a ground, and said gate of said second PMOS transistor forming said output terminal of said biasing unit, said drain of said second PMOS transistor being connected to said source of said second NMOS transistor and being said control terminal of said biasing unit, said gate and drain of said second PMOS transistor being connected to each other, and said N type bias voltage being applied to said gate of said second NMOS transistor.

6. The charge pump circuit of claim 1, wherein said charge pumping unit includes first and second PMOS transistors and first and second NMOS transistors, and gates of said first PMOS and NMOS transistors respectively form said first and second input terminals of said charge pumping unit, drains of said first PMOS and NMOS transistors are respectively connected to a power source and a ground, and a gate of said second NMOS transistor forms said bias terminal of said charge pumping unit, a drain of said second NMOS transistor is connected to said biasing unit and forms said output terminal of said charge pumping unit, and a constant P type bias voltage is applied to said gate of said second PMOS transistor.

7. The charge pump circuit according to claim 1, wherein said current mirror unit includes first and second PMOS transistors and first and second NMOS transistors, gates of said first PMOS and NMOS transistors are respectively connected to a ground and a power source, and drains of said first PMOS and NMOS transistors are respectively connected to sources of said second PMOS and NMOS transistors, and sources of said first PMOS and NMOS transistors are respectively connected to a power source and a ground, and said gate of said second NMOS transistor forms said bias terminal of said current mirror unit, and said drain of said second NMOS transistor is connected to said drain of said second PMOS transistor and forms said output terminal of said current mirror unit, and said P type bias voltage is applied to said gate of said second PMOS transistor.

8. The charge pump circuit according to claim 1, wherein said control unit has ±input terminals that form said first and second input terminals of said control unit, said control unit includes a comparator that controls voltage of said output terminal by a difference of the voltage applied to said ±input terminals and an NMOS transistor, and a source of said NMOS transistor is grounded, a gate of said NMOS transistor is connected to said output terminal of said comparator, and a drain of said NMOS transistor forms said output terminal of said control unit.

9. The charge pump circuit according to claim 1, wherein said biasing unit includes first and second PMOS transistors and first and second NMOS transistors, gates of said first PMOS and NMOS transistors are respectively connected to a ground and a power source, drains of said first PMOS and NMOS transistors are respectively connected to sources of said second PMOS and NMOS transistors, and sources of said first PMOS and NMOS transistors are respectively connected to a power source and a ground, and said gate of said second NMOS transistor forms said output terminal of said biasing unit, said source of said second NMOS transistor is connected to said drain of said second PMOS transistor and forms said control terminal of said biasing unit, and said gate and drain of said second NMOS transistor are connected to each other, and said P type bias voltage is applied to said gate of said second PMOS transistor.

* * * * *